(12) United States Patent
Pan et al.

(10) Patent No.: US 7,529,135 B2
(45) Date of Patent: May 5, 2009

(54) APPARATUS FOR CONTROLLING BITLINE BIAS VOLTAGE

(75) Inventors: Feng Pan, Fremont, CA (US); Trung Pham, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/617,531

(22) Filed: Dec. 28, 2006

(65) Prior Publication Data

US 2008/0159001 A1 Jul. 3, 2008

(51) Int. Cl.
*G11C 11/34* (2006.01)
*G11C 16/06* (2006.01)
*G11C 7/06* (2006.01)
*G11C 5/14* (2006.01)

(52) U.S. Cl. ............................. 365/185.21; 365/185.18; 365/185.25; 365/189.07; 365/189.09; 365/189.11; 365/189.12

(58) Field of Classification Search ............ 365/185.18, 365/185.21, 185.25, 189.09, 189.11, 189.07, 365/189.21

See application file for complete search history.

(56) References Cited

U.S. PATENT DOCUMENTS

| | | | |
|---|---|---|---|
| 4,943,945 A | | 7/1990 | Lai |
| 5,751,631 A | | 5/1998 | Liu et al. |
| 5,835,420 A | * | 11/1998 | Lee et al. ............... 365/189.09 |
| 5,963,485 A | * | 10/1999 | Brady et al. ............ 365/189.11 |
| 6,049,491 A | | 4/2000 | La Rosa |
| 6,157,581 A | * | 12/2000 | Higashi .................. 365/189.11 |
| 6,535,427 B1 | | 3/2003 | Takano et al. |
| 7,239,554 B2 | | 7/2007 | Jeong |
| 7,286,407 B2 | * | 10/2007 | Nakai et al. ............. 365/185.18 |
| 2007/0133293 A1 | * | 6/2007 | Chih ...................... 365/185.18 |

FOREIGN PATENT DOCUMENTS

EP    0321 226    6/1989

OTHER PUBLICATIONS

International Search Report dated Apr. 15, 2008 from PCT Application No. PCT/US2007/087299.
Written Opinion dated Apr. 15, 2008 from PCT Application No. PCT/US2007/087299.
Office Action dated Jul. 11, 2008 in U.S. Appl. No. 11/617,514.
U.S. Office Action for U.S. Appl. No. 11/617,514 mailed Jan. 25, 2008, 11 pages.
U.S. Office Action for U.S. Appl. No. 11/617,514 mailed Dec. 24, 2008, 16 pages.

* cited by examiner

*Primary Examiner*—Ly D Pham
(74) *Attorney, Agent, or Firm*—Davis Wright Tremaine LLP

(57) ABSTRACT

Controlling a bitline bias voltage by sensing the bitline bias voltage, modifying a bitline bias control signal in accordance with the sensed bitline bias voltage, and controlling the bitline bias voltage in accordance with the modified bitline bias control signal. The modifying the bitline bias control signal is carried out by enabling a pull up circuit and disabling a pull down circuit in response to a first control signal and disabling the pull up circuit and enabling the pull down circuit in response to a second control signal.

6 Claims, 4 Drawing Sheets

APPARATUS FOR CONTROLLING BITLINE BIAS VOLTAGE

CROSS REFERENCE TO RELATED APPLICATIONS

This application is related to co-pending patent application entitled "METHOD FOR CONTROLLING BITLINE BIAS VOLTAGE" by Pan et al. having application Ser. No. 11/617,514, filed concurrently herewith and incorporated by reference in its entirety for all purposes.

FIELD OF THE INVENTION

The present invention relates generally to programmable memory devices. More particularly, the present invention relates to a biasing circuit for non-volatile memory devices.

BACKGROUND

Non-volatile memory devices, and particularly FLASH memory devices, rely upon sense amplifiers to ascertain the programming state of the various memory cells by sensing a change, if any, in either a bitline voltage or current during a read or verify operation. In order to provide a reasonable noise margin, a bitline bias (of approximately 1.0V) is applied to the bitline prior to the initiation of the read/verify operation. Typically, the bitline voltage is generated by a bitline bias voltage generator circuit, which includes a current source that generates a pre-determined current $I_{REF}$ ($I_{REF}$ may be on the order of 10 µA) using a charge pump to provide the necessary supply voltage $V_{DD}$ (generally 5V).

Typical charge pumps are not very efficient, and consequently, the charge pump may consume a current of much greater than that of 10 uA from the chip power supply in order to provide an $I_{REF}$ of only 10 µA. Therefore, as a result of the large number of bitlines in a typical FLASH memory device (on the order of 128K), the charge pumps used to generate the bitline bias voltages alone can account for up to 15% of the total power requirement of the FLASH memory device.

Therefore, what is desired is an apparatus that provides power efficient control a bitline bias voltage.

SUMMARY

The invention can be implemented in numerous ways. Several embodiments of the invention are discussed below. As an apparatus for controlling a bitline bias voltage, one embodiment of the invention includes the following: a detector for sensing a bitline bias control signal associated with the bitline bias voltage of a bitline that generates a first control signal if the sensed bitline bias control signal indicates that the bitline is coupling low and is less than a first reference value and generates a second control signal if the sensed bitline bias control signal indicates that the bitline is coupling high and is greater than a second reference value; and a bitline bias control signal modification circuit coupled to the detector that modifies the bitline bias control signal in accordance with the first control signal and modifies the bitline bias control signal in accordance with the second control signal.

In another embodiment, an apparatus for controlling a bitline bias voltage, includes a detector for sensing the bitline bias voltage; a bitline bias control signal generation circuit coupled to the detector for generating a bitline bias control signal in accordance with the sensed bitline bias voltage; and a bitline bias voltage controller unit for controlling the bitline bias voltage in accordance with the bitline bias control signal.

In the described embodiments the bitline is connected to non-volatile memory cells arranged to form a non-volatile memory array suitable for storing data. The non-volatile memory array is arranged in a NAND-type memory array architecture having a number of wordlines and bitlines. Additionally, the described method is contemplated for use on a multilevel type memory array that when programmed stores data in the form of at least one lower page and at least one associated upper page.

BRIEF DESCRIPTION OF THE DRAWINGS

The invention, together with further objects and advantages thereof, may best be understood by reference to the following description taken in conjunction with the accompanying drawings.

In the drawings, like reference numerals designate like structural elements. Also, it should be understood that the depictions in the figures are not to scale.

DETAILED DESCRIPTION

Figure 1:
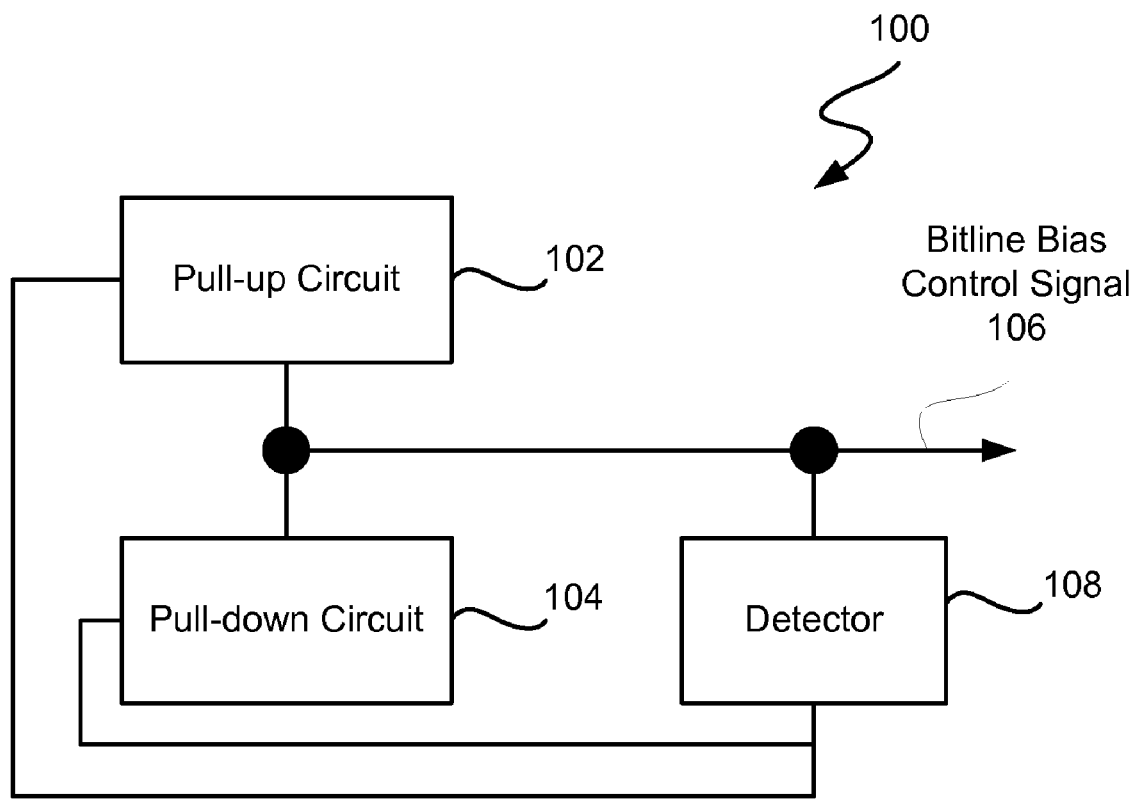
FIG. 1 illustrates a representative circuit for generating a bitline bias voltage control signal according to an embodiment of the present invention.

In the following description, numerous specific details are set forth in order to provide a thorough understanding of the present invention. It will be apparent, however, to one skilled in the art that the present invention may be practiced without some or all of these specific details. In the description below, an improved circuit and method for controlling a bitline bias voltage in a semiconductor memory device having a number of memory cells are described. In particular, a method is described for providing a bitline bias voltage control signal during a read or verify operation of a memory cell. The method significantly reduces the power consumed by the memory device by appropriately enabling and disabling pull-up and pull-down voltage circuits according to known variation of the bitline voltage level in different operations.

In the following description, the method of the present invention is described in relation to a non-volatile memory storage system, and particularly, in relation to a FLASH memory device comprising an array of memory cells organized into an array of memory strings, each memory string comprising one or more memory cells.

At the start of the read/verify cycle, but before a read or verify measurement occurs, the bitline associated with the selected memory cell is biased to a known bitline bias voltage $V_{READ}$. By way of example, $V_{READ}$ may be on the order of 1V. Unselected bitlines are often grounded. The wordline coupled with the control gate terminal of the selected memory cell is generally raised to a positive voltage $V_{SEL}$, although in some operations, the wordline may be grounded. In general, $V_{SEL}$ is set so as to be in between the programmed (generally positive) and non-programmed/erased (generally negative) gate threshold voltages. Wordlines corresponding to unselected memory cells on the same string as the selected memory cell may be biased to a pass voltage, $V_{PASS}$, such that the unselected memory function to pass the bitline voltage to the drain of the selected memory cell. It should be noted that in other array architectures, each memory cell drain terminal might be coupled directly with the bitline.

During a read/verify operation, the current, $I_{DS}$, running from the drain terminal to the source terminal of the selected memory cell will vary depending upon $V_{READ}$, $V_{SEL}$ and the threshold voltage, $V_T$, of the memory cell; the threshold voltage being a direct indication of the logic state stored by the memory cell. The current IDS (if any), also flows through the bitline, and additionally, through a sense amplifier coupled with the bitline. Depending upon the threshold voltage of the memory cell, the voltage $V_{SEL}$ applied to the gate of the selected memory cell will either be sufficient to turn on the memory cell such that it becomes conducting, or will be insufficient to turn on the selected memory cell leaving the selected memory cell in a non-conducting state. If the memory cell does not turn on, the bitline will not discharge and the sense amplifier will not detect a change in the bitline voltage level. It should be noted that in other embodiments, the sense amplifier is configured to detect a current rather than a change in bitline voltage. If the memory cell does turn on, the bitline associated with the selected memory cell will discharge and the sense amplifier will sense a change in voltage. The change in voltage detected by the sense amplifier (or alternatively the magnitude of the current detected) is indicative of the logic state of the memory cell. Furthermore, since the transconductance of the memory cell is a function of the threshold voltage $V_T$ of the memory cell and the voltage $V_{SEL}$ applied to the gate, the current passing through the sense amplifier, and therefore the change in voltage sensed by the amplifier, will vary according to the threshold voltage of the memory cell. Thus, even if the memory cells are multi-bit memory cells capable of being programmed into a multitude of programmed states, the sense amplifier is able to discern the programmed threshold voltage from the overall change in bitline voltage, and subsequently, the system is able to ascertain the logic state of the memory cell. It should be appreciated that the voltages $V_{SEL}$ and $V_{BL}$ should be carefully controlled, especially for multi-bit memory cells. In the described embodiment, the present invention relies upon current sensing in order to avoid varying of the bitline voltage such that any capacitive current does not interfere with the actual cell current thereby avoiding any read/verify errors.

For descriptive purposes, a potential bitline voltage level variation based upon operations may be sub-divided into four distinct regions. It should be noted that this subdivision is intended for descriptive purposes only. Region 1 is a voltage-settling region in which the bitline may be pre-charged from a starting pre-read or pre-verify voltage level up to a desired read or verify voltage level. By way of example, a typical starting voltage may be 0V while the desired level may be 1V. Region 2 is characterized by a relatively stable bitline voltage at the desired level. This is the region that sensing operation has not start. Region 3 results from the bitline coupling low, that is, the bitline bias voltage level has fallen due to discharging as a result of a read/verify operation. Discharging may additionally be extended as a result of capacitive coupling between the memory cell and the bitline, and particularly, between the gate and source terminals of the memory cell. Furthermore, when memory cells are arranged in a string, capacitive coupling may exist between the bitline and all of the memory cells on the string, not just the selected memory cell. Lastly, region 4 results from the bitline coupling high. During this region, the bitline is charged by the supply to prepare for the next sensing. Charging may also result through capacitive coupling between the memory cell(s) and the bitline. It should be appreciated that these coupling capacitors (particularly between gate and source terminals) may store a significant amount of charge, which may lead to increased bitline charging and discharging times and bitline biasing control signal setting time.

Embodiments of the present invention will now be described with respect to FIG. 1. The circuit 100 illustrated in FIG. 1 is a bitline bias control signal generation circuit arranged to provide control of the biasing of a bitline (not shown) in accordance with an embodiment of the invention. It should be noted that the circuit 100 provides improvements in regulating the bitline voltage resulting in better noise margin, reduced settling time and improved stability immediately prior to and after a read/verify operation of a selected memory cell. Circuit 100 includes a pull-up circuit 102 and a pull-down circuit 104 that in cooperation with each other affect a bitline biasing control signal 106. Circuit 100 also includes a detector 108 having an input arranged to monitor bitline biasing control signal 106. Detector 108 is further configured to enable the pull-up circuit 102 and disable the pull-down circuit 104 when the bitline biasing control signal 106 is low (as in region 3 described above). In the described embodiment, the detector 108 enables the pull-up circuit 102 and disables the pull-down circuit 104 by outputting a first pull-up signal when the bitline biasing control signal 106 indicates that a bitline bias voltage falls below a first reference voltage. By way of example, the first reference voltage may be obtained by subtracting a first threshold voltage $V_{TLOW}$ from the desired read/verify bitline bias voltage. A suitable first threshold voltage $V_{TLOW}$ may be approximately 10 mV for a desired read/verify bitline bias voltage.

Additionally, detector 108 is further configured to enable the pull-down circuit 104 and disable the pull-up circuit 102 when the bitline biasing control signal 106 indicates that the bitline bias voltage is being coupled high during bitline recovery, such as in region 4 described above. In the described embodiment, the detector 108 enables the pull-down circuit 104 and disables the pull-up circuit 102 by outputting a second pull-down signal when the bitline biasing control signal 106 indicates that the bitline bias voltage rises above a second reference voltage. By way of example, the second reference voltage may be obtained by adding a second threshold voltage $V_{THIGH}$ to the desired read/verify bitline bias voltage. Similarly, a suitable second threshold voltage $V_{THIGH}$ may be approximately 10 mV.

In various embodiments of the present invention, only the pull-up circuit 102 is enabled in regions 1 and 2 while the pull-down circuit 104 is disabled. Additionally, it should be appreciated that in region 3, only the pull-up circuit 102 is enabled while in region 4, only the pull-down circuit 104 is enabled. In this manner, by appropriately disabling the pull-up circuit the amount of power required to generate the bitline bias voltage for selected operational states of the semiconductor memory device is substantially reduced.

Figure 2:
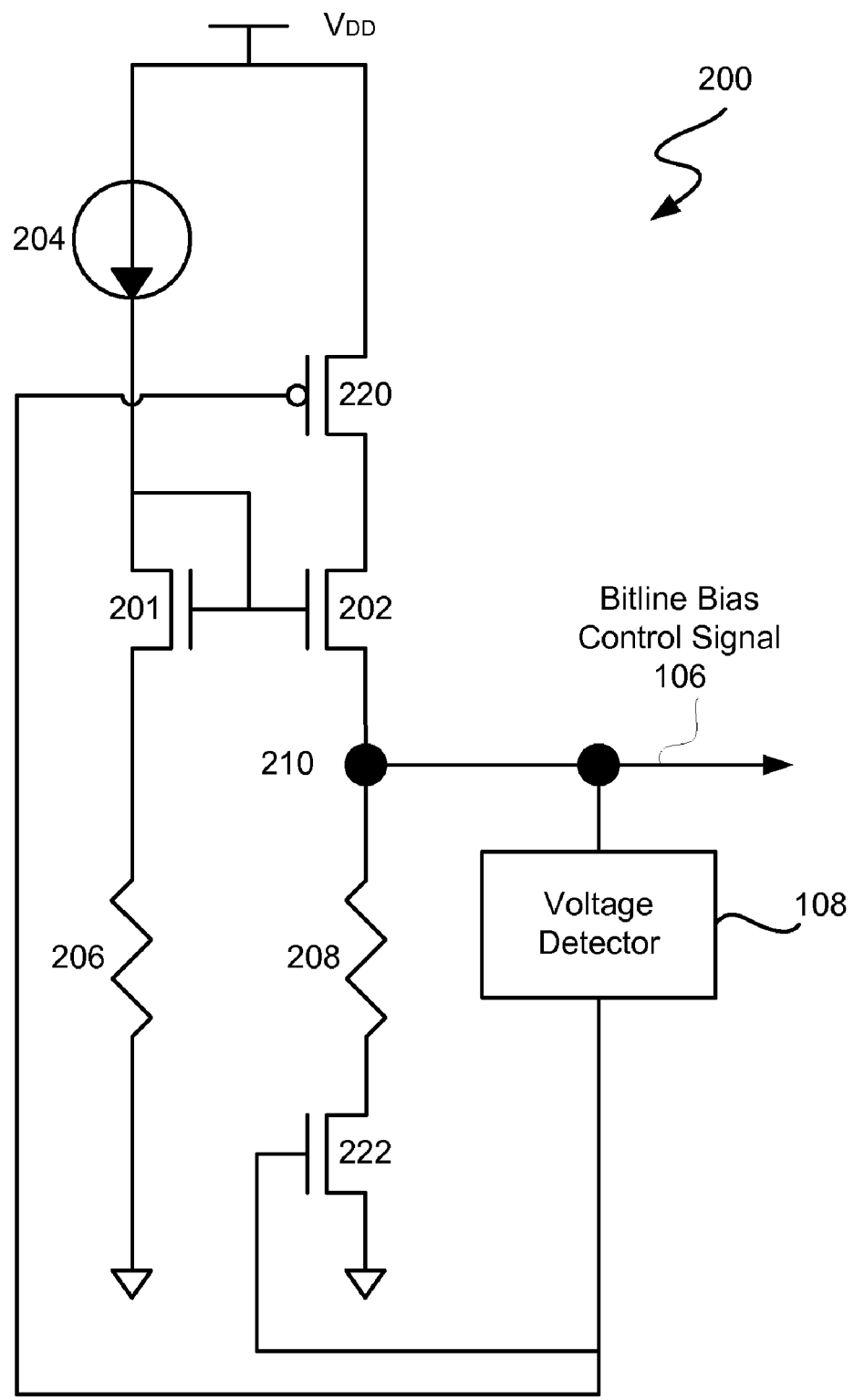
FIG. 2 illustrates a particular implementation of the circuit for generating a bitline bias voltage control signal shown in FIG. 1 according to an embodiment of the present invention.

FIG. 2 illustrates a circuit 200 as one particular embodiment of the bitline biasing control signal circuit illustrated in FIG. 1. In the illustrated embodiment, the circuit 200 includes a diode-connected NMOS transistor 201, a second NMOS transistor 202, resistive elements 206 and 208, and a current source 204 coupled with a supply voltage $V_{DD}$ that generates a cunent $I_{REF}$ ($I_{REF}$ may be on the order of 10 μA). The circuit 200 also includes the detector 108. Again, detector 108 is configured to detect the voltage level of the bitline biasing control signal 106. The detector 108 is coupled with a control gate of a pull-up transistor 220 and a control gate of a pull-down transistor 222. In the described embodiment, pull-up transistor 220 is a PMOS transistor and pull-down transistor 222 is an NMOS transistor. It should be noted that there is no need to have constant biasing cunent to flow from the power supply to the ground in order to maintain the bitline biasing voltage level. That's why the power is saved through out the entire operation.

In practice, the supply voltage $V_{DD}$ and current $I_{REF}$ may be generated via a charge pump coupled with a chip power supply $V_{CC}$ ($V_{CC}$ may be approximately 1.8V). Generally, the charge pump is used to ramp up the chip power supply voltage $V_{CC}$ to the supply voltage $V_{DD}$, which is typically 5V. Typical charge pumps are less efficient, and consequently, the charge pump may consume much higher amount of current from the chip power supply in order to provide an $I_{REF}$ of only 10 µA.

The source of pull-up transistor 220 is coupled to the supply voltage $V_{DD}$, while the drain of pull-up transistor 220 is connected with the drain of transistor 202. If the detector 108 senses that the voltage level on the bitline biasing control signal 106 is below the first reference voltage level, the pull-up signal is output from the detector 108 to the control gates of pull-up transistor 220 and pull-down transistor 222. The pull-up signal is sufficient to turn on pull-up transistor 220 thereby providing a current path from the bitline biasing power supply $V_{DD}$ to the bitline biasing control signals. The pull-up signal also turns off the pull-down transistor 222 (if not already off) thereby preventing any current flow from the bitline biasing control signal 106 through the resistor and subsequently to ground. Thus, the pull-up signal has the effect of raising the voltage level on the bitline biasing control signal 106. When the voltage level on the bitline biasing control signal 106 rises to the first reference voltage level (i.e. within $V_{TLOW}$ of the desired read/verify voltage $V_{READ}$), the pull-up signal is terminated.

The source of pull-down transistor 222 is coupled to ground, while the drain of pull-down transistor 222 is coupled with resistive element 208, which is coupled with the bitline biasing control signal 106. If the detector 108 senses that the voltage level on the bitline biasing control signal 106 is above the second reference voltage level, the pull-down signal is output from the detector 108 to the control gates of pull-up transistor 220 and pull-down transistor 222. The pull-down signal is sufficient to turn on pull-down transistor 222 thereby providing a current path from the bitline biasing control signal through the resistor and subsequently to ground. The pull-down signal also turns off the pull-up transistor 220 (if not already off) thereby preventing any current flow from the bitline biasing power supply to the bitline biasing control signal. Thus, the pull-down signal has the effect of lowering the voltage level on the bitline biasing control signal. When the voltage level on the bitline biasing control signal falls to the second reference voltage level (i.e. within $V_{THIGH}$ of the desired read/verify voltage $V_{READ}$), the pull-down signal is terminated.

It should be noted that in other embodiments additional elements might be present in bitline biasing control circuit 200. As these elements are not necessary to implement the present invention, they have not been described here. Moreover, it should be noted that the conductivity types of the transistors described in biasing circuit 200 may be reversed such that the NMOS transistors become PMOS transistors and vice versa. In this embodiment, various biases are also reversed.

Figure 3A:
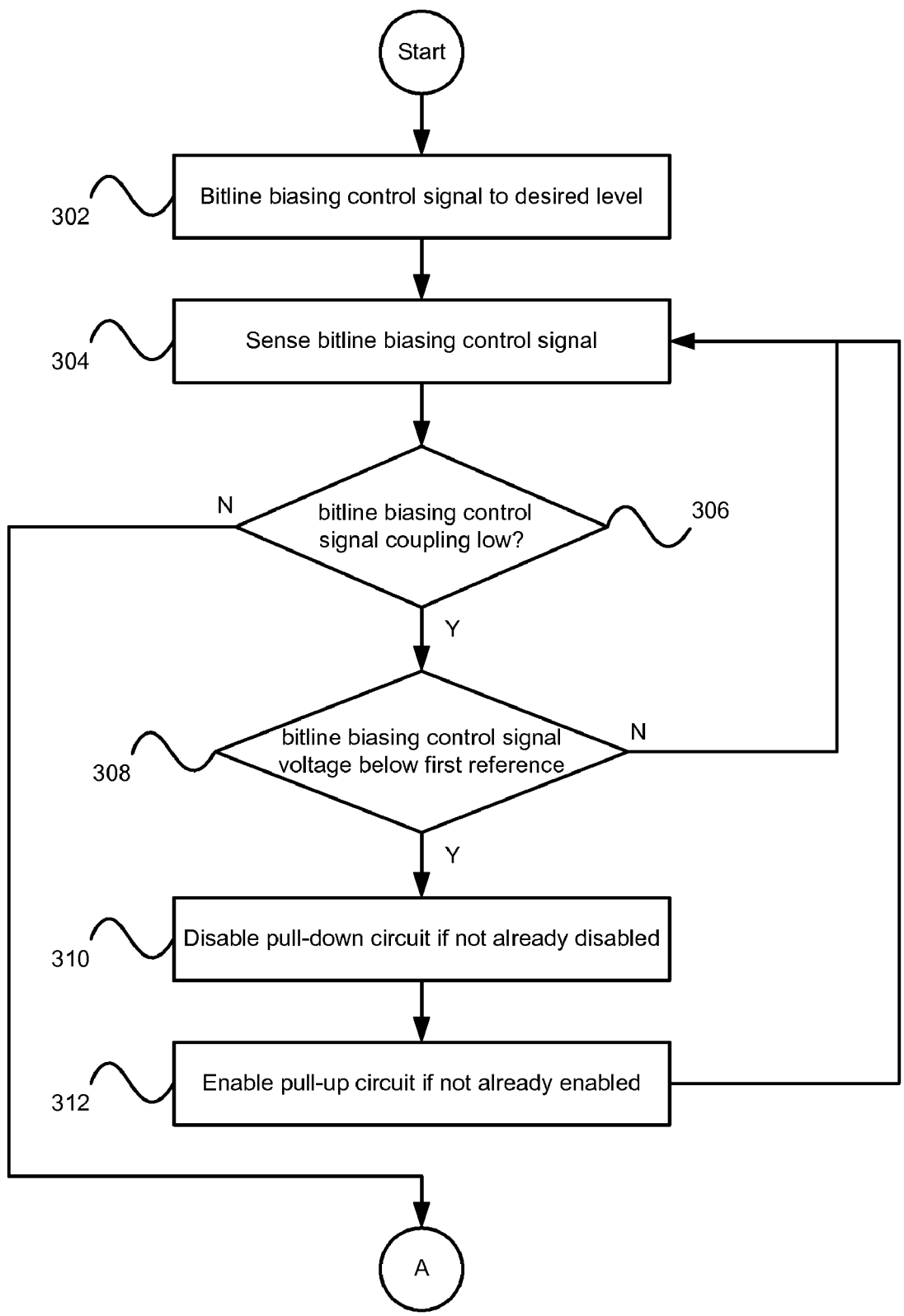
FIGS. 3A-3B show a flowchart illustrating a method of generating a bias voltage control signal according to an embodiment of the present invention.

In another aspect of the invention, a method of biasing a bitline biasing control signal will be described with respect to FIGS. 3A and 3B. FIG. 3A shows a flowchart illustrating a method of providing a bitline biasing control signal according to various embodiments of the present invention. Initially, at step 302, the voltage level on the bitline biasing control signal is biased to a desired read/verify voltage. By way of example, the bitline may be biased to a $V_{READ}$ of approximately 1V.

Next, at step 304, the bitline biasing control signal voltage is sensed and compared with a desired read/verify voltage. At 306, it is determined whether or not the bitline biasing control signal is in an operation where it is coupling low. If it is determined that the bitline biasing control signal is coupling low, then at 308 it is determined whether or not the bitline biasing control signal voltage level is below a first reference voltage level. In various embodiments, this first reference voltage level is obtained by subtracting a threshold voltage, $V_{TLOW}$, from the desired read/verify voltage level $V_{READ}$. By way of example, $V_{TLOW}$ may be 10 mV. If it is determined that the bitline biasing control signal voltage level is still above the first reference voltage level, then the operation returns to step 304. If it is determined that the bitline biasing control signal voltage level is below the first reference level, then at step 310 the pull-down circuit is disabled (if it is not already disabled). Next, at step 312; the pull-up circuit is enabled, which results in raising the bitline biasing control signal voltage level. The operation then proceeds back to step 304, where the bitline biasing control signal voltage is sensed again.

Figure 3B:
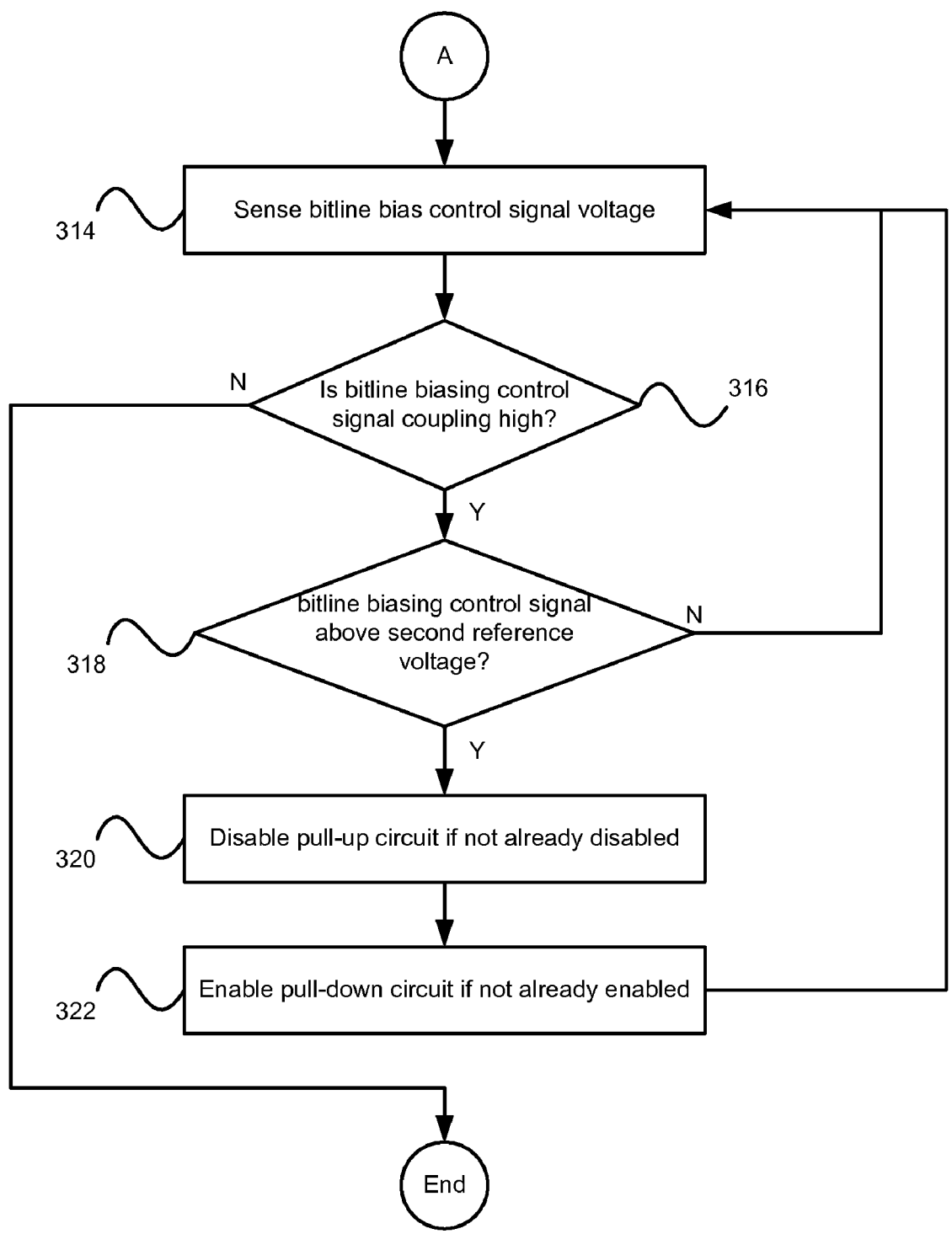

If it is determined at 306 that the bitline biasing control signal is not coupling low, then the method proceeds according to FIG. 3B where the bitline biasing control signal voltage is sensed at 314. At 316, it is determined whether or not the bitline is in an operation where it is coupling high. If it is determined that the bitline biasing control signal is coupling high, then at 318 it is determined whether or not the bitline biasing control signal voltage level is above a second reference voltage level. In various embodiments, this second reference voltage level is obtained by adding a threshold voltage, $V_{THIGH}$, to the desired read/verify voltage level $V_{READ}$. By way of example, $V_{THIGH}$ may be 10 mV. If it is determined that the bitline biasing control signal voltage level is still below the second reference voltage level, then the operation returns to step 314. If it is determined that the bitline biasing control signal voltage level is above the second reference level, then at step 320 the pull-up circuit is disabled (if it is not already disabled). Next, at step 322; the pull-down circuit is enabled (if it is not already enabled), which results in lowering the bitline biasing control signal voltage level. The operation then proceeds back to step 314, where the bitline biasing control signal voltage is sensed again. If it is determined at 316 that the bitline biasing control signal is not coupling high, then the operation ends.

Although only a few embodiments of the invention have been described in detail, it should be appreciated that the invention may be implemented in many other forms without departing from the spirit or scope of the invention. Although specific features and conditions have been described, it should be appreciated that a wide variety of implementations, such as bias conditions and method combinations, may be modified and employed as well. Accordingly, the present embodiments are to be considered as illustrative and not restrictive and the invention is not to be limited to the details given herein, but may be modified within the scope of the appended claims.

What is claimed is:

1. An apparatus for controlling a bitline bias voltage, comprising:
   a detector for sensing the bitline bias voltage;
   a bitline bias control signal generation circuit coupled to the detector for generating a bitline bias control signal in accordance with the sensed bitline bias voltage; and
   a bitline bias voltage controller unit for controlling the bitline bias voltage in accordance with the bitline bias control signal, wherein the bitline bias control signal generation circuit includes a sensor for sensing the bitline bias control signal;

a pull up circuit for pulling up the bitline bias control signal when the sensed bitline bias control signal indicates that the bitline is coupling low and that the sensed bitline bias control signal is less than a first reference value; and a pull down circuit for pulling down the bitline bias control signal when the sensed bitline bias control signal indicates that the bitline is coupling high and the sensed bitline bias control signal is greater than a second reference value.

2. An apparatus as recited in claim 1, wherein the control signals enable the pull up circuit and disable the pull down circuit when the bitline bias control signal is being pulled up.

3. An apparatus as recited in claim 2, wherein the control signals enable the pull down circuit and disable the pull up circuit when the bitline bias control signal is being pulled up.

4. An apparatus as recited in claim 3, wherein the control signals include a first control signal and a second control signal.

5. An apparatus as recited in claim 4, wherein the pull up circuit is enabled and the pull down circuit is disabled in response to the first control signal.

6. An apparatus as recited in claim 5, wherein the pull up circuit is disabled and the pull down circuit is enabled in response to the second control signal.

\* \* \* \* \*